(12) United States Patent
Kim

(10) Patent No.: US 12,457,696 B2
(45) Date of Patent: Oct. 28, 2025

(54) SOLID STATE DRIVE (SSD) DEVICE CASE ASSEMBLY AND SSD DEVICE USING THE SAME

(71) Applicant: Samsung Electronics Co., Ltd., Suwon-si (KR)

(72) Inventor: Jiyong Kim, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 218 days.

(21) Appl. No.: 18/121,925

(22) Filed: Mar. 15, 2023

(65) Prior Publication Data

US 2024/0015901 A1    Jan. 11, 2024

(30) Foreign Application Priority Data

Jul. 5, 2022 (KR) .......................... 10-2022-0082444

(51) Int. Cl.
*G06F 1/16* (2006.01)
*H05K 5/00* (2006.01)

(52) U.S. Cl.
CPC .................................. *H05K 5/006* (2013.01)

(58) Field of Classification Search
CPC .... H05K 5/0047; H05K 5/0052; H05K 5/006; H05K 5/0208; H05K 5/062; H05K 5/063; H05K 5/066; H05K 5/10; H05K 5/13; H05K 5/15
See application file for complete search history.

(56) References Cited

U.S. PATENT DOCUMENTS

| | | | |
|---|---|---|---|
| 5,548,164 A * | 8/1996 | Hillard | B60R 25/045 307/10.3 |
| 5,755,348 A | 5/1998 | Luch et al. | |
| 5,931,706 A * | 8/1999 | Bassi | H01R 13/501 411/403 |
| 5,973,399 A * | 10/1999 | Stark | H05K 7/1431 438/106 |
| 7,301,776 B1 * | 11/2007 | Wang | G06F 21/78 360/137 |
| 11,350,538 B2 | 5/2022 | Kim | |
| 11,520,381 B2 * | 12/2022 | Eliyahu | G06F 1/1658 |

(Continued)

FOREIGN PATENT DOCUMENTS

| | | |
|---|---|---|
| KR | 1019990035028 A | 5/1999 |
| KR | 20010048138 A | 6/2001 |

(Continued)

*Primary Examiner* — Anthony Q Edwards
(74) *Attorney, Agent, or Firm* — Muir Patent Law, PLLC

(57) ABSTRACT

A solid state drive (SSD) device according to an exemplary embodiment includes: a board including on which a plurality of non-volatile memory (NVM) chips, a controller chip, and a buffer memory chip are mounted; a first cover covering a first surface of the board and including a fastening portion having a coupling-hole and recessed toward the board; a second cover covering a second surface of the board and coupled to the first cover; a fastening member having one end portion passing through the coupling-hole to fasten the first cover and the second cover to each other; and a cap inserted into the fastening portion to block exposure of the fastening member and irreversibly coupled to the fastening portion.

18 Claims, 8 Drawing Sheets

(56) References Cited

U.S. PATENT DOCUMENTS

| | | | | |
|---|---|---|---|---|
| 2010/0192344 | A1* | 8/2010 | Zollmann | B25B 13/48 |
| | | | | 411/407 |
| 2012/0033390 | A1* | 2/2012 | Chen | H05K 5/0208 |
| | | | | 361/752 |
| 2014/0076772 | A1* | 3/2014 | Azumi | H05K 5/0052 |
| | | | | 206/706 |
| 2014/0160698 | A1* | 6/2014 | Farquhar | H05K 5/0256 |
| | | | | 361/752 |
| 2014/0254071 | A1* | 9/2014 | Uchino | H05K 5/13 |
| | | | | 361/679.01 |
| 2017/0156222 | A1* | 6/2017 | Chen | H05K 5/0086 |
| 2021/0251088 | A1* | 8/2021 | Su | B29C 65/10 |

FOREIGN PATENT DOCUMENTS

| | | |
|---|---|---|
| KR | 20010083395 A | 9/2001 |
| KR | 100482152 B1 | 4/2005 |
| KR | 20080008080 A | 1/2008 |
| KR | 101313532 B1 | 10/2013 |
| KR | 101424268 B1 | 7/2014 |
| KR | 20190046482 A | 5/2019 |
| KR | 102040001 B1 | 11/2019 |
| KR | 20210067656 A | 6/2021 |
| KR | 20220018690 A | 2/2022 |

* cited by examiner

SOLID STATE DRIVE (SSD) DEVICE CASE ASSEMBLY AND SSD DEVICE USING THE SAME

CROSS-REFERENCE TO RELATED APPLICATION

This application claims priority under 35 U.S.C. § 119 to and the benefit of Korean Patent Application No. 10-2022-0082444, filed in the Korean Intellectual Property Office on Jul. 5, 2022, the entire contents of which are incorporated herein by reference.

BACKGROUND OF THE INVENTION

(a) Field of the Invention

The present disclosure relates to a solid state drive (SSD) device case assembly and an SSD device using the same.

(b) Description of the Related Art

A solid state drive (SSD) device is a storage device based on a non-volatile memory, and is capable of inputting/outputting a large amount of data at a high speed, and thus the demand therefor is increasing.

In general, the SSD device has a structure in which upper and lower cases cover a module in which an SSD is mounted on a printed circuit board (PCB).

However, since the upper and lower cases are assembled in such a way that they are coupled by a fastening member such as bolts, the SSD device according to the related art has a problem in that it is easy to disassemble, and access to the SSD from the outside is possible.

The above information disclosed in this Background section is only for enhancement of understanding of the background of the invention, and therefore it may contain information that does not form the prior art that is already known in this country to a person of ordinary skill in the art.

SUMMARY OF THE INVENTION

The present invention has been made in an effort to provide a solid state drive (SSD) device case assembly capable of detecting an attempt to disassemble a case.

The present invention has also been made in an effort to provide an SSD device capable of detecting access to an SSD from the outside or an attempt to disassemble a case.

An exemplary embodiment of the present invention provides a solid state drive (SSD) device including: a board including a connector connected to an external device, having a through-hole, and on which a plurality of non-volatile memory (NVM) chips, a controller chip, and a buffer memory chip are mounted; a first cover covering a first surface of the board and including a fastening portion having a coupling-hole and having a pocket shape recessed toward the board; a second cover covering a second surface of the board, having a fastening groove corresponding to the coupling-hole, and coupled to the first cover; a fastening member having one end portion fixed to the fastening groove through the coupling-hole and the through-hole, and fastening the first cover and the second cover to each other; and a cap inserted into the fastening portion to block exposure of the fastening member and irreversibly coupled to the fastening portion, in which the board is covered by the first cover and the second cover so that the board is not externally exposed.

The cap may include a head having a shape corresponding to a shape of an inlet of the fastening portion to seal the fastening portion, and a protrusion protruding from the head toward the board and having an end portion having a hook shape to be caught by the fastening portion.

A plurality of sawtooth-shaped projections may protrude from an outer side of the end portion of the protrusion.

The protrusion may include a first extension portion extending perpendicularly to one surface of the head that faces the board, and a second extension portion extending obliquely outward from an end of the first extension portion, and an angle between the first extension portion and the second extension portion may be an acute angle.

The fastening portion may include a seating groove having a stepped shape so that the head is seated, and an accommodating groove connected to the seating groove, having a pocket shape recessed toward the board, and accommodating the other end portion of the fastening member.

An auxiliary groove extending from the seating groove may be provided in an inner surface of the accommodating groove, and the protrusion may be positioned in the auxiliary groove.

A lip to which the protrusion is caught may protrude in the auxiliary groove.

The seating groove may have an auxiliary hole through which the protrusion passes.

A width of the auxiliary hole may be smaller than a maximum width of the protrusion in a radial direction of the accommodating groove.

Another embodiment of the present invention provides a solid state drive (SSD) device including: a board on which a plurality of non-volatile memory (NVM) chips, a controller chip, and a buffer memory chip are mounted; a first cover and a second cover respectively coupled to a first surface and a second surface of the board with the board interposed therebetween to cover the board; a fastening member penetrating through an inwardly recessed fastening portion provided in the first cover and the board, and fixed to a fastening groove provided in the second cover; and a cap snap-fitted to the fastening portion to be irreversibly coupled to the fastening portion and sealing the fastening portion.

The cap may include a head having a shape corresponding to a shape of an inlet of the fastening portion to seal the fastening portion, and a protrusion protruding from the head toward the board and coupled to the fastening portion.

The protrusion may be formed of a material having elasticity and thus have a shape restoring force.

At least one projection that is inclined in such a way that a protruding height increases as the distance from the board increases may protrude from an outer side of the protrusion.

The at least one projection may be engaged with a lip protruding from an inner surface of the fastening portion.

The at least one projection may pass through an auxiliary hole provided in the fastening portion, and a maximum protruding height of the at least one projection may be larger than a width of the auxiliary hole.

Yet another embodiment of the present invention provides a solid state drive (SSD) device case assembly including: a first cover and a second cover respectively coupled to a first surface and a second surface of a board on which a plurality of non-volatile memory (NVM) chips, a controller chip, and a buffer memory chip are mounted, with the board interposed therebetween to cover the board; a fastening member penetrating through a fastening portion provided in the first cover and having an inwardly recessed pocket shape, and fixed to a fastening groove provided in the second cover; and a cap snap-fitted to the fastening portion to be irreversibly coupled to the fastening portion and sealing the fastening portion.

According to an exemplary embodiment, as the cap covers the fastening member that fastens the case in which the SSD device is accommodated, it is possible to detect access to the SSD or an attempt to disassemble the case.

In addition, in a process of assembling the SSD device, it is possible to standardize and automate installation of the cap.

DETAILED DESCRIPTION OF THE EMBODIMENTS

Figure 1:
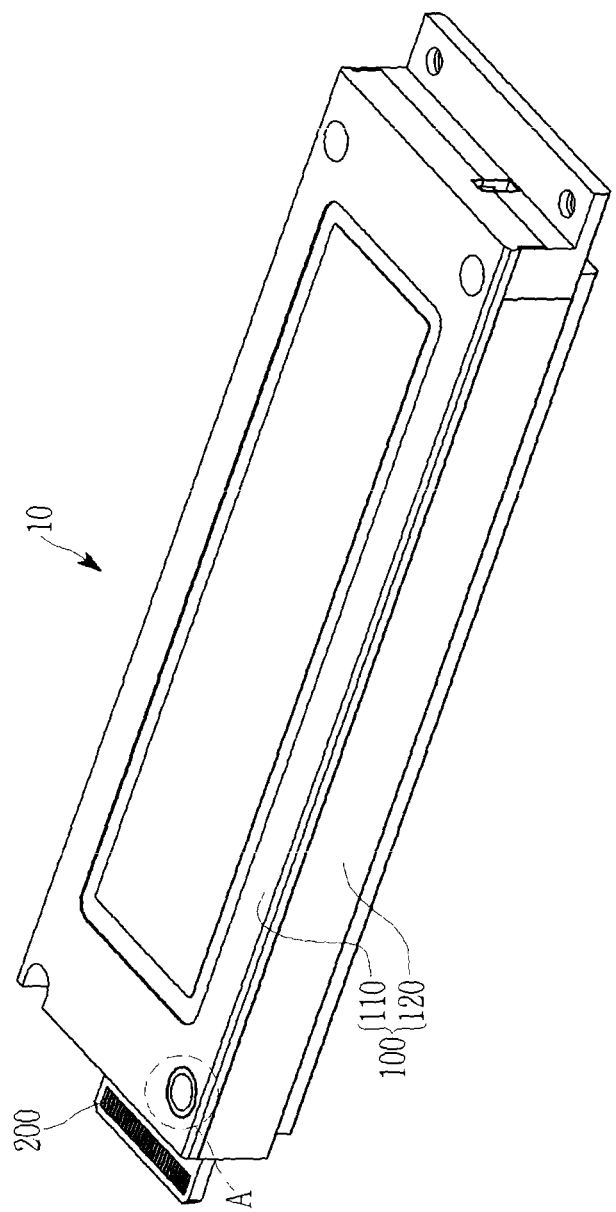
FIG. 1 is a perspective view of a solid state drive (SSD) device according to an exemplary embodiment.

Hereinafter, exemplary embodiments of the present invention will be described in detail with reference to the accompanying drawings so that those skilled in the art may easily practice the present invention. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

In addition, since sizes and thicknesses of the respective components illustrated in the drawings are arbitrarily illustrated for convenience of explanation, the present invention is not necessarily limited to those illustrated in the drawings.

Throughout the present specification, when any portion is referred to as being "connected to" another portion, it includes a case in which any portion and another portion are "indirectly connected to" each other with the other portion interposed therebetween as well as a case in which any portion and another portion are "directly connected to" each other. For example, it will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. In addition, throughout the present specification, unless explicitly described to the contrary, the word "comprise" and variations such as "comprises" or "comprising", will be understood to imply the inclusion of stated elements but not the exclusion of any other elements.

Figure 2:
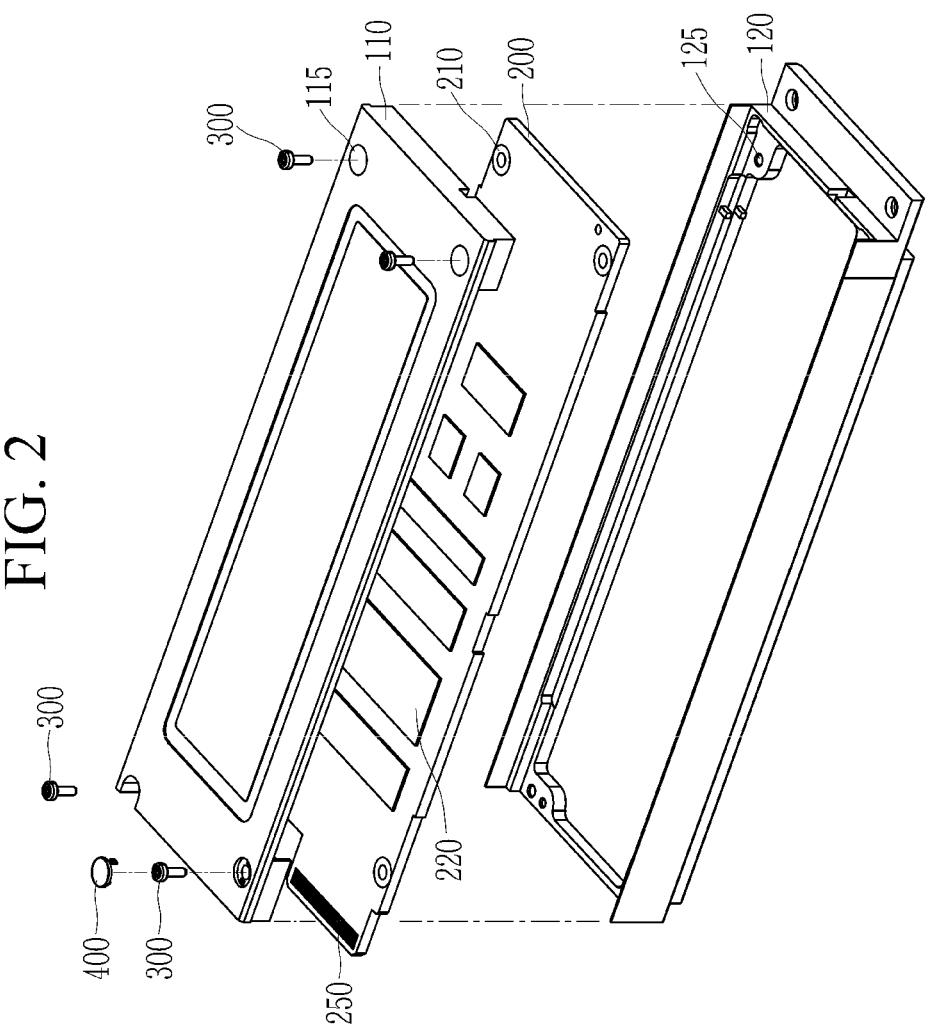
FIG. 2 is an exploded perspective view of the SSD device according to an exemplary embodiment.

FIG. 1 is a perspective view of a solid state drive (SSD) device according to an exemplary embodiment, and FIG. 2 is an exploded perspective view of the SSD device according to an exemplary embodiment.

Referring to FIGS. 1 and 2, an SSD device 10 according to an exemplary embodiment may include a board 200 and a case assembly for accommodating the board 200 and assembling a case 100. The board 200 may include a printed circuit board (PCB), and may have a form of a module on which a solid state drive (or solid state disk) (SSD) 220 is mounted.

The SSD is a concept including a plurality of chips configured to function as a data storage device. For example, the SSD may include a plurality of non-volatile memory (NVM) chips for data storage, a controller chip that controls a data exchange operation between an interface (for example, a connection port) and a memory, and a buffer memory chip for reducing a speed difference between an external device and the SSD.

As described above, the board 200 has a form of a module in which the SSD is mounted on a printed circuit board. For example, the board 200 may be a module in which a plurality of non-volatile memory chips, a controller chip, and a buffer memory chip are mounted on a board to functions as the SSD.

The board 200 may have a through-hole 210 through which a fastening member 300 may pass. Therefore, the board 200 may be fixed to the case 100 by the fastening member 300. In example embodiments, the through-hole 210 may be a plurality of through-holes 210 and the fastening member 300 may be a plurality of fastening members 300. For example, each of the plurality of fastening members 300 may pass through a corresponding one of the through-holes 210 to attach the board 200 to the case 100.

The board 200 may include a connector 250 for connection to an external device, the connector 250 being provided on one side of the board 200. The connector 250 may be exposed to the outside of the case 100.

However, the SSD 220 is not exposed to the outside of the case 100 to prevent access from the outside. For example, the case 100 may accommodate the board 200 while covering the board 200 in such a way that the plurality of non-volatile memory chips, the controller chip, and the buffer memory chip included in the SSD 220 are not exposed to the outside.

Referring to FIGS. 1 and 2, the case assembly may include the case 100, the fastening member 300, and a cap 400. According to an exemplary embodiment, the cap 400 covering the fastening member 300 is included, and it is thus possible to prevent access to the fastening member 300 to disassemble the SSD device 10 or the case 100. In example embodiments, a plurality of caps 400 may be provided, and each cap 400 may cover a corresponding one of the fastening members 300.

Further, according to an exemplary embodiment, the cap 400 may be irreversibly coupled to the case 100. For example, the cap 400 may be coupled to the case 100, but the coupled cap 400 is not able to be separated from the case 100. Since it is impossible to separate the cap 400 without damaging the cap 400, it is possible to detect whether the SSD device 10 or the case 100 is disassembled by checking whether the cap 400 is damaged. A detailed configuration of the cap 400 will be described below.

According to an exemplary embodiment, the case 100 may include a first cover 110 and a second cover 120 respectively covering opposite sides of the board 200 with the board 200 interposed therebetween. The first cover 110 and the second cover 120 may contact the opposite sides of the board 200, encapsulating the SSDs 220 mounted on the board 220. The case 100 in which the first cover 110 and the second cover 120 are coupled may have an overall rectangular parallelepiped shape, but is not limited thereto, and may have various shapes.

The first cover 110 may cover a first surface (for example, an upper surface) of the board 200. As described above, the first cover 110 may completely cover a region in which the SSD 220 is mounted on the first surface of the board 200 to prevent the SSD 220 on the first surface of the board 200 from being exposed. For example, the first cover 110 may be coupled by the fastening member 300 in a state in which an edge portion of the first cover 110 is in contact with the first surface of the board 200.

According to an exemplary embodiment, the first cover 110 may have a fastening portion 115. The fastening portion 115 may be a portion through which the fastening member 300 passes, and a coupling-hole 119 (see FIGS. 6, 8, and 9) through which the fastening member 300 passes may be provided.

The fastening portion 115 may have an inwardly recessed shape. For example, the fastening portion 115 may have a shape recessed in a direction toward the board 200 from an outer surface of the first cover 110, and may have a pocket shape as a whole. An internal space of the fastening portion 115 may have a cylindrical shape, but is not limited thereto, and may have various shapes. For example, as illustrated in FIGS. 1 and 2, the internal space of the fastening portion 115 may have a deformed pillar shape obtained by cutting one side of a cylinder.

The fastening member 300 may be partially positioned in the internal space of the fastening portion 115. Accordingly, the fastening member 300 is prevented from protruding from the outer surface of the first cover 110.

The fastening portion 115 may be positioned at each of a plurality of edge portions of the first cover 110. Since the plurality of fastening portions 115 have the same configuration, hereinafter, one fastening portion 115 will be described as a reference. A more detailed description of the fastening portion 115 will be described below.

The second cover 120 may cover a second surface (for example, a lower surface) of the board 200. As described above, the second cover 120 may completely cover a region in which the SSD 220 is mounted on the second surface of the board 200 to prevent the SSD 220 on the second surface of the board 200 from being exposed. For example, the second cover 120 may be coupled by the fastening member 300 in a state in which an edge portion of the second cover 120 is in contact with the second surface of the board 200.

The second cover 120 may have a fastening groove 125. The fastening groove 125 may correspond to the coupling-hole 119 (see FIGS. 6, 8, and 9) of the first cover 110. Alternatively, the fastening groove 125 may correspond to the through-hole 210 of the board 200. One end portion of the fastening member 300 may be fixed to the fastening groove 125. For example, one end portion of the fastening member 300 inserted into the fastening portion 115 of the first cover 110 and passing through the coupling-hole 119 (see FIGS. 6, 8, 9, and the like) may pass through the through-hole 210 of the board 200 and be fixed to the fastening groove 125. In a case where a screw thread is formed at one end portion of the fastening member 300, a screw thread corresponding to the screw thread of the fastening member 300 may be formed on an inner surface of the fastening groove 125.

Meanwhile, the fastening member 300 may be coupled to the second cover 120 without completely passing through the coupling-hole 119. For example, the other end portion of the fastening member 300 may be positioned in a state of being inserted into the internal space of the fastening portion 115 without passing through the coupling-hole 119.

The fastening member 300 may fasten the first cover 110 and the second cover 120 to each other. According to an exemplary embodiment, the fastening member 300 may fix the first cover 110 and the second cover 120 respectively positioned on opposite sides of the board 200 with the board 200 interposed therebetween. For example, the fastening member 300 may penetrate through each of the first cover 110 and the board 200 and be fixed to the second cover 120. Accordingly, the first cover 110 and the second cover 120 may be coupled on opposite sides of the board 200 in such a way as to prevent access to the board 200 while fixing the board 200 in the case 100.

The fastening member 300 may include well-known fastening members such as bolts and screws. For example, the fastening member 300 may include a head having a relatively large diameter, and an elongated body extending from the head. Accordingly, one end portion (body) of the fastening member 300 may pass through a through-hole of the first cover 110 and the through-hole 210 of the board 200, but the other end portion (head) of the fastening member 300 may be positioned in the fastening portion 115 of the first cover 110.

Meanwhile, according to an exemplary embodiment, the number of fastening members 300 may correspond to the number of plurality of fastening portions 115.

As described above, the fastening member 300 positioned in the fastening portion 115 may be covered by the cap 400. For example, the cap 400 may block the exposure of the fastening member 300 to prevent access to the fastening member 300.

According to an exemplary embodiment, the cap 400 may be irreversibly coupled to the fastening portion 115. Here, the phrase "irreversibly coupled" may mean that the cap 400 may be coupled (assembled) to the fastening portion 115, but the coupled cap 400 is not able to be separated from the fastening portion 115 without detection. Accordingly, the cap 400 is inevitably damaged to separate the cap 400 from the fastening portion 115, and it is thus possible to detect access to the fastening member 300 by detecting whether the cap 400 is damaged.

The cap 400 may be installed in such a way that the cap 400 is inserted into the fastening portion 115. Accordingly, the cap 400 may seal the fastening portion 115 exposed to the outside. For example, the cap 400 may have a shape corresponding to the shape of the fastening portion 115 to be inserted into the fastening portion 115. In this case, the cap 400 may not protrude from the fastening portion 115. Accordingly, it may be difficult to separate the cap 400 from the outside. In addition, since the fastening portion 115 is sealed by the cap 400, it is possible to prevent foreign substances from entering the fastening portion 115 and affecting the board 200 or the SSD 220.

As described above, the fastening portions 115 may be provided at a plurality of portion of the first cover 110, but the cap 400 may be coupled to only one of the plurality of fastening portions 115. This is because all the plurality of fastening members 300 need to be separated in order to access the SSD 220, and it is thus possible to detect access to the SSD 220 or detect whether the SSD device 10 is disassembled, even in a case where only one fastening portion 115 is sealed by the cap 400. However, the cap 400 is not limited to being coupled to one fastening portion 115, and may also be coupled to one or more fastening portions 115 or all of the plurality of fastening portions 115.

According to an exemplary embodiment, the cap 400 may be irreversibly coupled to the fastening portion 115 by being snap-fitted to the fastening portion 115. The snap-fitting is a method of coupling with other parts by using a deformable part having a shape restoring force. For example, in a process of assembling one part and another part, the one part may be deformed due to contact with the another part, and then, the shape of the one part may be restored and mechanically coupled with the another part. Here, in a case where the deformable part has directivity (for example, the deformable part is deformed in a first case where an external force is applied in one direction, and the deformable part is not deformed in a second case where an external force is applied in the opposite direction), the two parts may be irreversibly coupled to each other.

Hereinafter, various examples of the cap 400 that may be snap-fitted to the fastening portion 115 and irreversibly coupled thereto and various examples of the fastening portion 115 corresponding thereto will be described with reference to the drawings.

Figure 3:
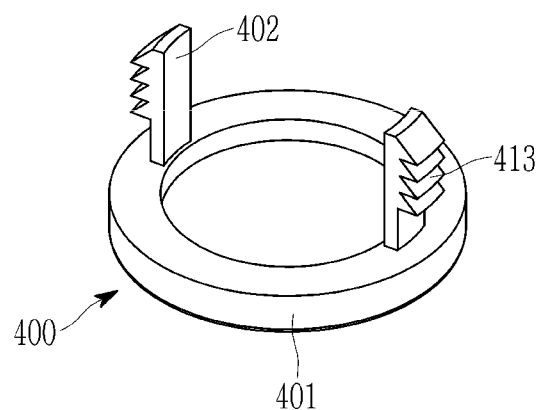
FIG. 3 is a view illustrating a shape of a cap in the SSD device according to an exemplary embodiment.
Figure 4:
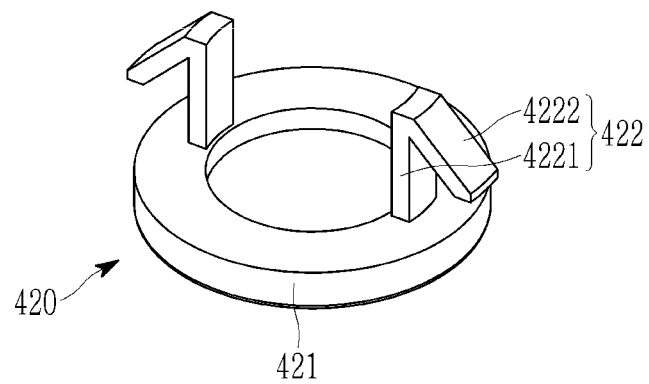
FIG. 4 is a view illustrating another shape of the cap in the SSD device according to an exemplary embodiment.

FIG. 3 is a view illustrating a shape of the cap in the SSD device according to an exemplary embodiment, and FIG. 4 is a view illustrating another shape of the cap in the SSD device according to an exemplary embodiment.

Referring to FIG. 3, the cap 400 may include a head 401 and a protrusion 402. The head 401 may be a portion sealing the fastening portion 115 and have a shape corresponding to a shape of an inlet of the fastening portion 115. For example, the head 401 may have a disk shape. The protrusion 402 may be a portion coupled to the fastening portion 115 and may protrude and extend from one surface of the head 401. For example, the protrusion 402 may protrude from an edge portion of one surface of the head 401 that faces the board 200, in a direction perpendicular to the one surface.

According to an exemplary embodiment, an end portion of the protrusion 402 may have a hook shape to be caught by the fastening portion 115. Here, the fastening portion 115 may have a structure in which a projection, a hole, or the like to which the end portion of the hook-shaped protrusion 402 can be caught, and as a result of which the cap 400 may be coupled to the fastening portion 115.

For example, an inclined protrusion (that is inclined in such a way that a protruding height increases as the distance from the board increases) may protrude from an outer side of the protrusion 402 (the outer side is a side facing the outside in a radial direction of the head). Here, the protrusion 402 may be formed of a material having elasticity and thus have a shape restoring force. For example, the protrusion 402 may be formed of a polymer material such as plastic or rubber, or may be formed of a metal material.

Referring to FIG. 3, a plurality of sawtooth-shaped projections 413 may protrude from the outer side of the protrusion 402. Each of the plurality of projections 413 may have an inclined shape, and may have a shape inclined in such a way that a protruding height increases as the distance from the head 401 decreases. Although FIG. 3 illustrates three sawtooth-shaped projections 413, the number of sawtooth-shaped projections 413 is not limited thereto, and there may be two or fewer sawtooth-shaped projections 413 or four or more sawtooth-shaped projections 413.

The cap 400 may include at least one protrusion 402. Although the cap 400 including two protrusions 402 is illustrated in FIG. 3, the number of protrusions 402 is not limited thereto, and the cap 400 may include one or three or more protrusions 402. For example, in a case where the number of protrusions 402 is one, the protrusion 402 may have a cylindrical shape, and in a case where the number of protrusions 402 is plural, the plurality of protrusions 402 may be arranged at uniform intervals in a circumferential direction.

FIG. 4 illustrates a cap 420 having a different shape from that of the cap 400 illustrated in FIG. 3. A protrusion 422 may include a first extension portion 4221 extending perpendicularly to one surface of a head portion 421, and a second extension portion 4222 extending obliquely outward from an end of the first extension portion 4221. Here, an angle between the first extension portion 4221 and the second extension portion 4222 may be an acute angle. For example, the protrusion 422 may have a shape inclined in such a way that a protruding height increases as the distance from the head 421 decreases. Accordingly, the protrusion 422 may have a wedge shape as a whole.

Figure 5:
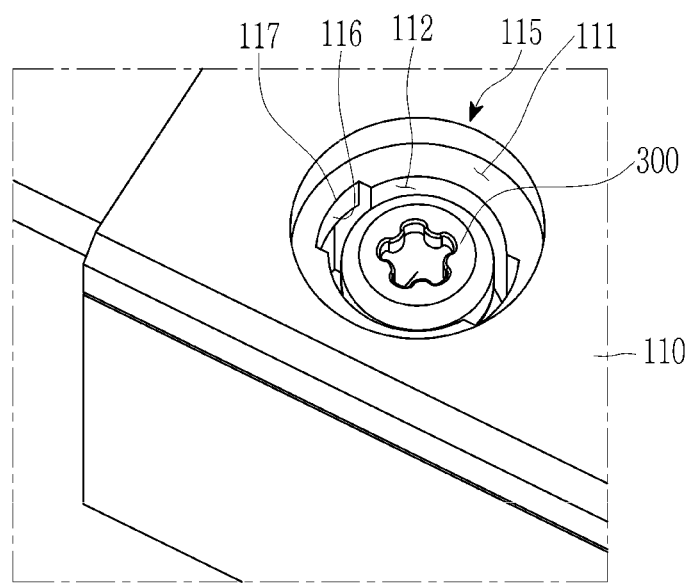
FIG. 5 is a view illustrating a shape of a fastening portion at which the cap is installed in the SSD device according to an exemplary embodiment.
Figure 6:
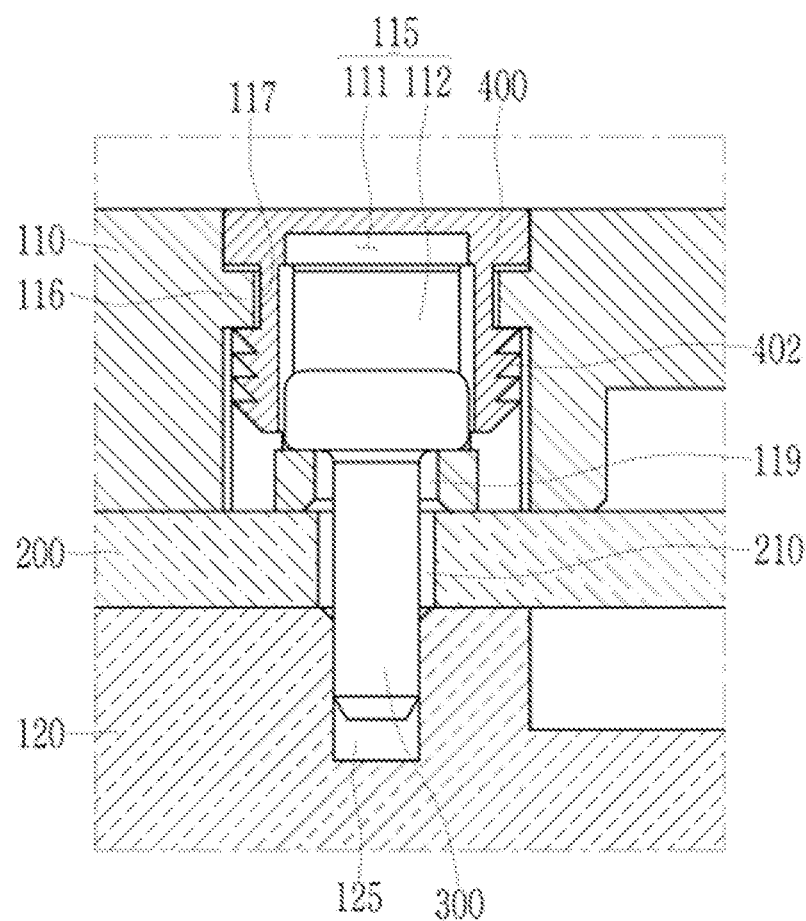
FIG. 6 is a cross-sectional view of FIG. 5.

FIG. 5 is a view illustrating the shape of the fastening portion at which the cap is installed in the SSD device according to an exemplary embodiment, and FIG. 6 is a cross-sectional view of FIG. 5. FIG. 5 illustrates a state in which the cap 400 is removed for convenience of understanding.

Referring to FIGS. 5 and 6, the fastening portion 115 may include a seating groove 111 and an accommodating groove 112. For example, the fastening portion 115 may have a two-step structure recessed in a stepped form.

The seating groove 111 is an inlet portion of the fastening portion 115, and may have a stepped shape so that the head 401 of the cap 400 is seated. For example, when viewed in a plan view, the seating groove 111 may have a larger diameter than that of the accommodating groove 112 while being concentric with the accommodating groove 112.

The accommodating groove 112 may be connected to the seating groove 111 and have a more deeply recessed shape, and may have a pocket shape. Accordingly, the other end portion (head) of the fastening member 300 that does not pass through the coupling-hole 119 may be accommodated in the seating groove 111.

Referring to FIGS. 5 and 6, an auxiliary groove 117 may be provided in an inner surface of the accommodating groove 112. The auxiliary groove 117 may vertically extend from a bottom surface of the seating groove 11.

The protrusion 402 of the cap 400 may be positioned in the auxiliary groove 117. Here, a lip 116 to which the protrusion 402 is caught may protrude from the auxiliary groove 117. Accordingly, at least one projection protruding on the outer side of the protrusion 402 is caught by the lip 116, so that the cap 400 may be coupled to the fastening portion 115.

Referring to FIGS. 3 and 6, the plurality of sawtooth-shaped projections 413 protruding on the outer side of the protrusion 402 may be inclined in such a way that the protruding height increases as the distance from the board 200 increases. Accordingly, when the cap 400 is coupled to the fastening portion 115 toward the board, the protrusion 402 may be partially deformed to pass through a space in which the lip 116 protrudes. However, when separating the cap 400 from the fastening portion 115, the protrusion 402 prevents the cap 400 from moving in a direction away from the board 200, so that the cap 400 is not able to be separated from the fastening portion 115.

As illustrated in FIG. 6, according to an exemplary embodiment, an inner side of the protrusion 402 may be supported by the fastening member 300 in a state in which the cap 400 is coupled to the fastening portion 115. Accordingly, in a state in which the cap 400 is coupled to the fastening portion 115, a path in which the protrusion 402 is deformed in a direction away from the lip 116 may be blocked. Therefore, it may be more difficult to separate the cap 400 from the fastening portion 115.

Meanwhile, FIG. 6 illustrates a state in which the cap 400 having the form illustrated in FIG. 3 is coupled to the fastening portion 115 having the form illustrated in FIG. 5, but the present disclosure is not limited thereto. For example, the cap 420 having the form illustrated in FIG. 4 may be coupled to the fastening portion 115 having the form illustrated in FIG. 5, and in this case, the description with reference to FIG. 6 is equally applied.

Figure 7:
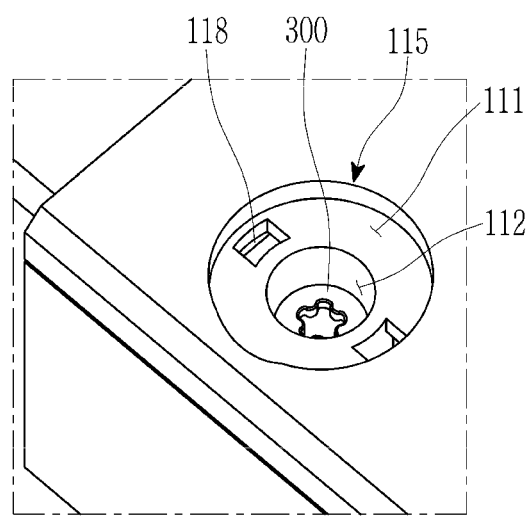
FIG. 7 is a view illustrating another shape of the fastening portion at which the cap is installed in the SSD device according to an exemplary embodiment.
Figure 8:
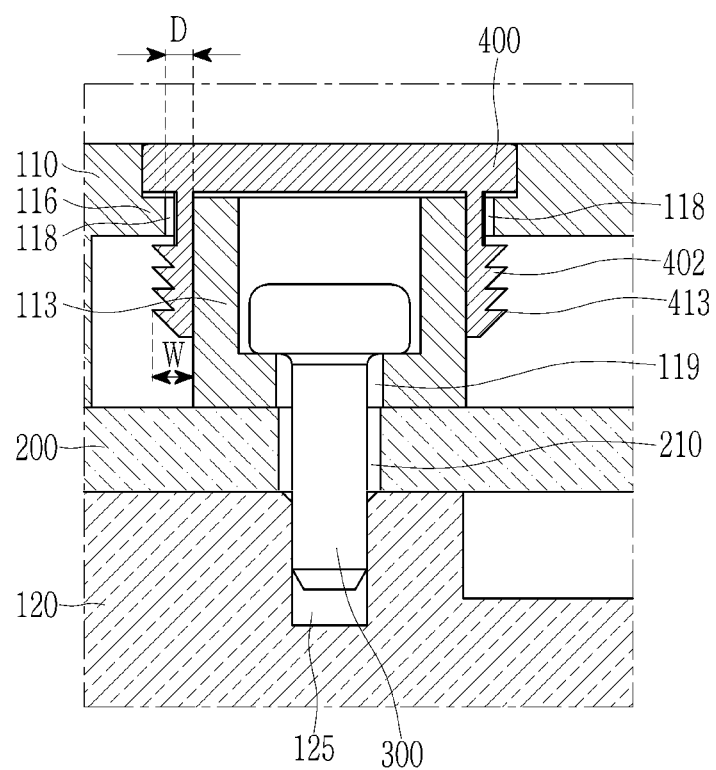
FIGS. 8 and 9 are cross-sectional views of FIG. 7.
Figure 9:
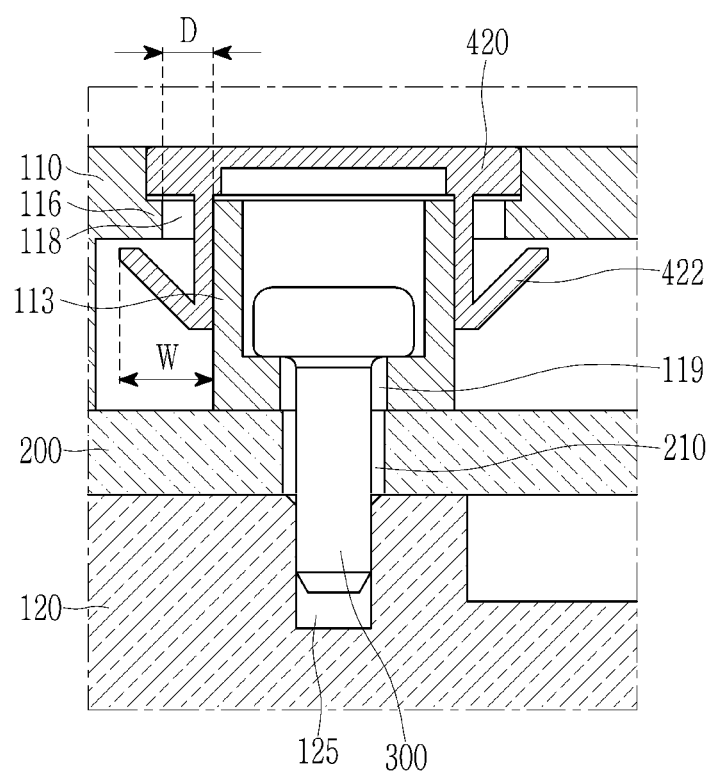

FIG. 7 is a view illustrating another shape of the fastening portion at which the cap is installed in the SSD device according to an exemplary embodiment, and FIGS. 8 and 9 are cross-sectional views of FIG. 7. FIG. 7 illustrates a state in which the cap 400 is removed for convenience of understanding.

Referring to FIGS. 7 to 9, an auxiliary hole 118 may be provided in the accommodating groove 111. The protrusion 402 of the cap 400 and the protrusion 422 of the cap 420 may pass through the auxiliary hole 118. The number of auxiliary holes 118 may correspond to the number of protrusions.

Referring to FIGS. 3 and 8, the plurality of sawtooth-shaped projections 413 protruding on the outer side of the protrusion 402 may be inclined in such a way that the protruding height increases as the distance from the board 200 increases. Here, a width D of the auxiliary hole 118 may be smaller than a maximum width W of the protrusion 402 in the radial direction of the accommodating groove 112 or the head 401. Accordingly, when the cap 400 is coupled to the fastening portion 115 toward the board, the protrusion 402 may be partially deformed to pass through the auxiliary hole 118. However, when separating the cap 400 from the fastening portion 115, the protrusion 402 prevents the cap 400 from moving in a direction away from the board 200, so that the cap 400 is not able to be separated from the fastening portion 115.

Referring to FIGS. 4 and 9, the protrusion 422 includes the second extension portion 4222 that is a protrusion extending obliquely outward. The protruding second extension portion 4222 may be inclined in such a way that the protruding height increases as the distance from the board 200 increases. Here, the width D of the auxiliary hole 118 may be smaller than a maximum width W of the second extension portion 4222 in the radial direction of the accommodating groove 112 or the head 401. Accordingly, when the cap 400 is coupled to the fastening portion 115 toward the board, the protrusion 422 may be partially deformed to pass through the auxiliary hole 118. However, when separating the cap 400 from the fastening portion 115, the protrusion 402 prevents the cap 400 from moving in a direction away from the board 200, so that the cap 400 is not able to be separated from the fastening portion 115.

Referring to FIGS. 7 to 9, the inner side of the protrusion 402 or 422 may be supported by an outer wall 113 of the seating groove 112 in a state in which the cap 400 or 420 is coupled to the fastening portion 115. For example, since the fastening portion 115 has a pocket shape recessed toward the board 200, when viewed from the bottom of the first board 110, the fastening portion 115 may have an outer wall 115. In this case, the inner side of the protrusion 402 or the first extension portion 4221 may be supported by the outer wall 115. Therefore, it may be more difficult to separate the caps 400 and 420 from the fastening portion 115.

As such, in the SSD device and the SSD device case assembly according to an exemplary embodiment, the fastening member 300 that fastens the case 100 may be covered by the cap 400, thereby preventing access to the SSD 220 or an attempt to disassemble the case 100. In addition, as the cap 400 is irreversibly coupled to the case 100, it is possible to detect access to the SSD 220 or detect whether the case 100 is disassembled by detecting whether the cap 400 is damaged.

Although the exemplary embodiment of the present invention has been described above, the present invention is not limited thereto, and it is possible to carry out various modifications within the scope of the claims, the detailed description of the invention, and the accompanying drawings. It goes without saying that the modifications fall within the scope of the present invention.

DESCRIPTION OF SYMBOLS

10 SSD device
100 Case
110 First cover
120 Second cover
200 Board
300 Fastening member
400 Cap

What is claimed is:

1. A solid state drive device comprising:
a board including a connector exposed to the outside and connected to an external device, having a through-hole, and on which a plurality of non-volatile memory (NVM) chips, a controller chip, and a buffer memory chip are mounted;
a first cover covering a first surface of the board and including a fastening portion having a coupling-hole and recessed toward the board;
a second cover covering a second surface of the board, having a fastening groove corresponding to the coupling-hole, and coupled to the first cover;
a fastening member having one end portion fixed to the fastening groove through the coupling-hole and the through-hole, and fastening the first cover and the second cover to each other; and
a cap inserted into the fastening portion to block exposure of the fastening member and irreversibly coupled to the fastening portion,
wherein the board is covered by the first cover and the second cover so that the board is not externally exposed,
wherein the cap includes:
a head having a shape corresponding to a shape of an inlet of the fastening portion to seal the fastening portion, and
a protrusion protruding from the head toward the board and having an end portion having a hook shape to be caught by the fastening portion, and
wherein the fastening portion includes:
a seating groove having a stepped shape so that the head is seated, and
an accommodating groove connected to the seating groove, having a pocket shape recessed toward the board, and accommodating the other end portion of the fastening member.

2. The solid state drive device of claim 1, wherein a plurality of sawtooth-shaped projections protrude from an outer side of the end portion of the protrusion.

3. The solid state drive device of claim 1,
wherein the protrusion comprises:
- a first extension portion extending perpendicular to one surface of the head that faces the board, and
- a second extension portion extending obliquely outward from an end of the first extension portion, and wherein an angle between the first extension portion and the second extension portion is an acute angle.

4. The solid state drive device of claim 1,
wherein an auxiliary groove extending from the seating groove is provided in an inner surface of the accommodating groove, and
wherein the protrusion is positioned in the auxiliary groove.

5. The solid state drive device of claim 4, wherein a lip to which the protrusion is caught protrudes in the auxiliary groove.

6. The solid state drive device of claim 1, wherein the seating groove has an auxiliary hole through which the protrusion passes.

7. The solid state drive device of claim 6, wherein a width of the auxiliary hole is smaller than a maximum width of the protrusion in a radial direction of the accommodating groove.

8. A solid state drive device comprising:
- a board on which a plurality of non-volatile memory (NVM) chips, a controller chip, and a buffer memory chip are mounted;
- a first cover and a second cover respectively coupled to a first surface and a second surface of the board with the board interposed therebetween to cover the board;
- a fastening member penetrating through an inwardly recessed fastening portion provided in the first cover and the board, and fixed to a fastening groove provided in the second cover; and
- a cap snap-fitted to the fastening portion to be irreversibly coupled to the fastening portion and sealing the fastening portion, wherein the cap comprises a protrusion protruding toward the board and having an end portion having a hook shape to be caught by the fastening portion, and
wherein the fastening portion includes:
- a seating groove having a stepped shape, and
- an accommodating groove connected to the seating groove, having a pocket shape recessed toward the board, and accommodating an end portion of the fastening member.

9. The solid state drive device of claim 8, wherein the cap further comprises:
- a head having a shape corresponding to a shape of an inlet of the fastening portion to seal the fastening portion, wherein the protrusion protrudes from the head toward the board and is coupled to the fastening portion.

10. The solid state drive device of claim 9, wherein the protrusion is formed of a material having elasticity and has a shape restoring force.

11. The solid state drive device of claim 9, wherein at least one projection that is inclined in such a way that a protruding height increases as the distance from the board increases protrudes from an outer side of the protrusion.

12. The solid state drive device of claim 11, wherein the at least one projection is engaged with a lip protruding from an inner surface of the fastening portion.

13. The solid state drive device of claim 11, wherein the at least one projection passes through an auxiliary hole provided in the fastening portion, and a maximum protruding height of the at least one projection is larger than a width of the auxiliary hole.

14. A solid state drive device case assembly comprising:
- a first cover and a second cover respectively coupled to a first surface and a second surface of a board on which a plurality of non-volatile memory (NVM) chips, a controller chip, and a buffer memory chip are mounted, with the board interposed therebetween to cover the board;
- a fastening member penetrating through a fastening portion provided in the first cover and having an inwardly recessed pocket shape, and fixed to a fastening groove provided in the second cover; and
- a cap snap-fitted to the fastening portion to be irreversibly coupled to the fastening portion and sealing the fastening portion, wherein the cap comprises a protrusion protruding toward the board and having an end portion having a hook shape to be caught by the fastening portion, and
wherein the fastening portion includes:
- a seating groove having a stepped shape, and
- an accommodating groove connected to the seating groove, having a pocket shape recessed toward the board, and accommodating end portion of the fastening member.

15. The solid state drive device case assembly of claim 14, wherein the cap further comprises:
- a head having a shape corresponding to a shape of an inlet of the fastening portion to seal the fastening portion, wherein the protrusion protrudes from the head toward the board and is coupled to the fastening portion.

16. The solid state drive device case assembly of claim 14, wherein the protrusion is formed of a material having elasticity and has a shape restoring force.

17. The solid state drive device case assembly of claim 14, wherein at least one projection that is inclined in such a way that a protruding height increases as the distance from the board increases protrudes from an outer side of the protrusion.

18. The solid state drive device case assembly of claim 14, wherein at least one projection is engaged with a lip protruding from an inner surface of the fastening portion.

* * * * *